United States Patent [19]
Yoon

[11] Patent Number: 6,028,785
[45] Date of Patent: Feb. 22, 2000

[54] MEMORY DEVICE FOR STORING MULTI-DATA

[75] Inventor: Min Ho Yoon, Ichon-shi, Rep. of Korea

[73] Assignee: Hyundai Electronics Industries Co., Inc., Kyoungki-Do, Rep. of Korea

[21] Appl. No.: 09/342,523

[22] Filed: Jun. 29, 1999

[30]      Foreign Application Priority Data

Jun. 29, 1998 [KR] Rep. of Korea ..................... 98-24816

[51] Int. Cl.$^7$ .................................. G11C 11/56
[52] U.S. Cl. ................ 365/168; 365/185.03; 365/185.23
[58] Field of Search ............................. 365/168, 185.03, 365/185.23

[56]               References Cited

U.S. PATENT DOCUMENTS

| | | | |
|---|---|---|---|
| 4,701,884 | 10/1987 | Aoki et al. ............................... | 365/189 |
| 4,896,301 | 1/1990 | Ogawa ................................. | 365/230.03 |
| 5,262,984 | 11/1993 | Noghuchi et al. ....................... | 365/185 |
| 5,394,355 | 2/1995 | Uramoto et al. ......................... | 365/104 |
| 5,550,772 | 8/1996 | Gill ..................................... | 365/185.03 |
| 5,570,315 | 10/1996 | Tanaka et al. ...................... | 365/185.22 |
| 5,642,312 | 6/1997 | Harari ................................. | 365/185.33 |
| 5,771,208 | 6/1998 | Iwase et al. ............................. | 365/168 |

*Primary Examiner*—David Nelms
*Assistant Examiner*—Tuan T. Nguyen
*Attorney, Agent, or Firm*—Thelen Reid & Priest, LLP

[57]                ABSTRACT

A memory device for storing multi-data comprises an input level detector for receiving data through n input terminals and selecting one of $2^n$ output terminals corresponding to the data inputted to the input terminals; a word line switching unit for outputting one of $2^n$ reference voltages corresponding to the outputs from the input level detector; and a word line driver for receiving the output from the word line switching unit and transferring it to the corresponding word line of the memory device.

3 Claims, 2 Drawing Sheets

MEMORY DEVICE FOR STORING MULTI-DATA

BACKGROUND OF THE INVENTION

1. Field of the Invention

The present invention relates to a memory device for storing multi-data, and more particularly to a memory device for storing multi-data which stores a plurality of data information in a memory cell.

2. Description of the Prior Art

In general, one-bit data (i.e., 0 or 1) is stored in a memory cell of a conventional memory device.

However, with the development of semiconductor technology over the years, a memory device has been provided which is capable of storing multi-data (i.e., two-bit data; 00, 01, 10, and 11) in a unit memory cell. Prior memory devices for storing multi-data are provided in the U.S. Pat. No. 5,771,208, Sharp Kabushiki Kaisha, Japan and in the U.S. Pat. No. 5,394,355, Mitsubishi Denki Kabushiki Kaisha, Japan, etc. However, there is a problem that such prior memory devices require supplementary word lines or a number of cell capacitors to process multi-data operation.

SUMMARY OF THE INVENTION

The present invention has been made in view of the above problem, and it is an objective of the present invention to provide a memory for storing multi-data which is capable of storing a plurality of data information in a unit memory cell without using a number of word lines and cell capacitors.

The preferred embodiment of the present invention is to provide a memory for storing multi-data comprising:

- an input level detector for receiving data through n input terminals and selecting one of $2^n$ output terminals corresponding to the data inputted to the input terminals;
- a word line switching unit for outputting one of $2^n$ reference voltages corresponding to the outputs from the input level detector; and
- a word line driver for receiving the output from the word line switching unit and transferring it to the corresponding word line of the memory device.

In the preferred embodiment of the present invention, the word line switching unit includes $2^n$ switch elements; each of the switch elements receives corresponding a reference voltage and provides the corresponding voltage to the corresponding word line.

BRIEF DESCRIPTION OF THE DRAWINGS

The above and other objectives, features and advantages of the present invention will be more clearly understood from the following detailed description taken in conjunction with the accompanying drawings, in which.

DETAILED DESCRIPTION OF THE PREFERRED EMBODIMENTS

The memory device for storing multi-data of the present invention will hereinafter be described with reference to FIGS. 1 and 4.

Figure 1:
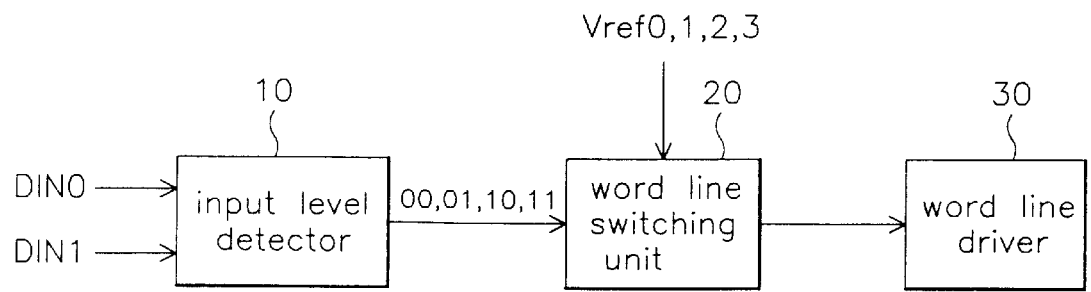
FIG. 1 is a block diagram illustrating the construction of a memory for storing multi-data in accordance with the present invention.

FIG. 1 is a block diagram illustrating the construction of a memory device for storing multi-data according to the present invention. The input level detector 10 receives data DIN0 and DIN1 from data input buffers (not shown) and selects one of 4 data level detecting signals 00, 01, 10, and 11 corresponding to the received data. The word line switching unit 20 outputs one of 4 reference voltages Vref0, Vref1, Vref3, and Vref4 corresponding to the outputs from the input level detector 10. The word line driver 30 receives the output from the word line switching unit 20 and transfers it to the corresponding word line of the memory device.

Figure 2:
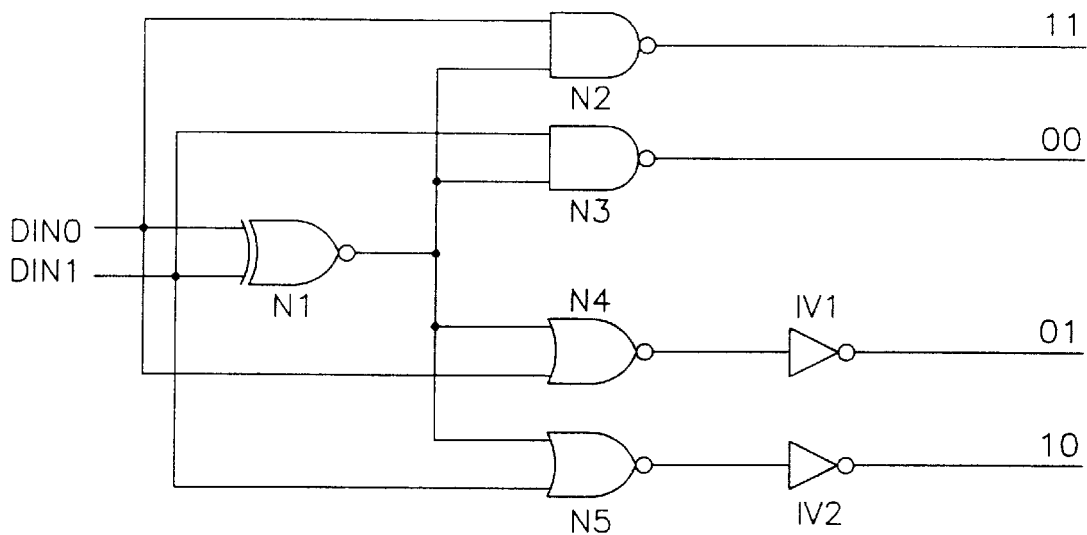
FIG. 2 is a circuit diagram of the input level detector shown in FIG. 1.

As shown in FIG. 2. the input level detector 10 receives a plurality of data DIN0 and DIN1 from a plurality of data input buffers (for example, 2 buffers). The received data DIN0 and DIN1 are input to the Exclusive-NOR gate N1. The input level detector further includes 2 NAND gates N2 and N3 and 2 NOR gates N4 and N5. The data DIN0 is input to the input terminal of the NAND gate N2 and to the input terminal of the NOR gate N2. The data DIN1 is input to the input terminal of the NAND gate N3 and to the input terminal of the NOR gate N5. The output of the Exclusive-NOR gate N1 is input to each input terminal of the gates N2, N3, N4, and N5. The output of the NOR gate N4 is input to the inverter IV1, and the output of the NOR gate N5 is input to the inverter IV2. When each of the data values DIN0 and DIN1 is 1 (data value of DIN0) and 1 (data value of DIN1), data level detecting signal 11 which is an output signal from the NAND gate N2 is selected. When each of the data value DIN0 and DIN1 is 0 (data value of DIN0) and 0 (data value of DIN1), the data level detecting signal 00 which is an output signal from the NAND gate N3 is selected. When each of the data values DIN0 and DIN1 is 0 (data value of DIN0) and 1 (data value of DIN1), the data level detecting signal 01 which is output signal from the inverter IV1 is selected. When each of the data values DIN0 and DIN1 is 1 (data value of DIN0) and 0 (data value of DIN1), the data level detecting signal 10 which is an output signal from the inverter IV2 is selected.

Figure 3:
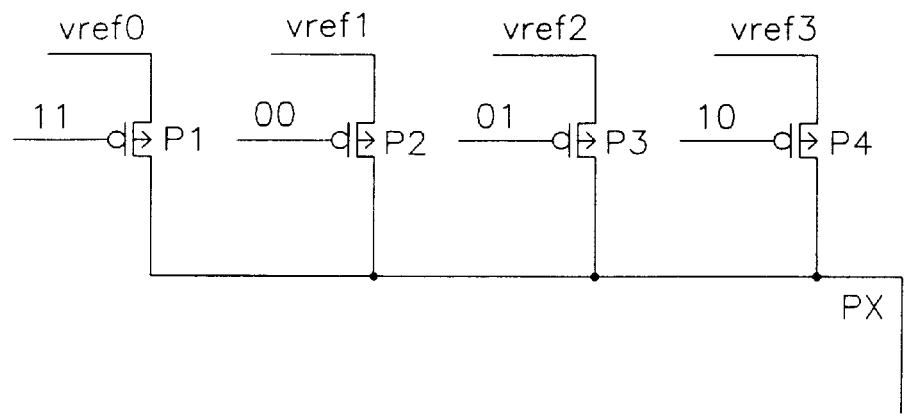
FIG. 3 is a circuit diagram of a word line switching unit shown in FIG. 1.

FIG. 3 is a circuit diagram of a word line switching unit 20 shown in FIG. 1. The word line switching unit 20 includes a plurality of MOS transistors P1, P2, Ps and P4, each of which is controlled by the data level detecting signals.

The gate of the PMOS transistor P1 is controlled by the data level detecting signal 11. When the data level detecting signal 11 is logic low, the PMOS transistor P1 transfers the reference voltage Vref0 to the word line driver so as to activate the corresponding word line of the memory cell.

The gate of the PMOS transistor P2 is controlled by the data level detecting signal 00. When the data level detecting signal 00 is logic low, the PMOS transistor P2 transfers the reference voltage Vref1 to the word line driver so as to activate the corresponding word line of the memory cell.

The gate of the PMOS transistor P3 is controlled by the data level detecting signal 01. When the data level detecting signal 01 is logic low, the PMOS transistor P3 transfers the reference voltage Vref2 to the word line driver so as to activate the corresponding word line of the memory cell.

The gate of the PMOS transistor P4 is controlled by the data level detecting signal 10. When the data level detecting signal 10 is logic low, the PMOS transistor P4 transfers the reference voltage Vref3 to the word line driver so as to activate the corresponding word line of the memory cell.

Figure 4:
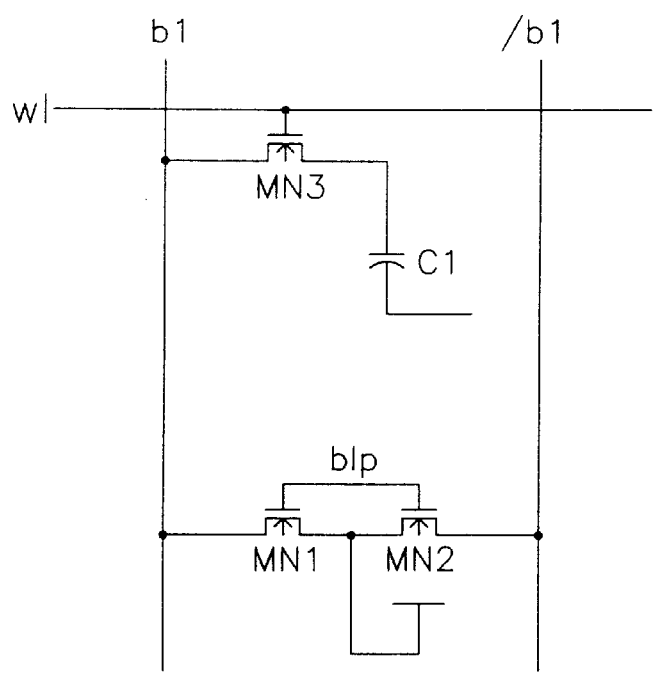
FIG. 4 is a circuit diagram of a word line driver shown in FIG. 1.

The boosting signal PX shown in FIG. 3 is one of the 4 reference voltages and is substantially similar to the voltage level of the word line wl shown in FIG. 4.

FIG. 4 is a circuit diagram of a word line driver 30 shown in FIG. 1. The word line driver includes a conventional memory cell construction. It includes MOS transistors MN1 and MN2 which are located between a pair of bit lines bl and /bl to pre-charge a bit line pair bl and /bl with a constant voltage, for example Vcc, by the control of bit line pre-charge signal blp, a MOS transistor MN3 which is a memory cell transistor, and a memory cell capacitor C1.

In operation, when a write command signal is enabled, the selected pair of bit lines is pre-charged with a constant voltage Vcc by the control of the bit line pre-charge signal blp After this, when data DIN0 and DIN1 are input to the input level detector 10 shown in FIG. 1, the input level detector 10 selects one of the data level detecting signals which are substantial output terminals of the input level detector according to the voltage levels of the input data.

For example, when each level of the input data DIN0 and DIN1 is "1" and "1", the NAND gate N2 outputs logic low, and the other data level detecting signals 00, 01, 10 output logic high.

When each level of the input data DIN0 and DIN1 is "0" and "0", the NAND gate N3 outputs logic low, and the other data level detecting signals 11, 01, 10 output logic high.

When each level of the input data DIN0 and DIN1 is "0" and "1", the inverter IV1 outputs logic low, and the other data level detecting signals 11, 00, 10 output logic high.

When each level of the input data DIN0 and DIN1 is "1" and "0", the inverter IV2 outputs logic low, and the other data level detecting signals 11, 00, 01 output logic high.

Therefore, word line switch unit 20 transfers one of the 4 reference voltages Vref0, Vref1, Vref2, and Vref3 to the corresponding word line according to the output signal from the input level detector 10.

For example, in the case of the voltage source Vcc=3 V, a threshold voltage of the NMOS transistor Vth=0.7 V, the reference voltage Vref0=3.7 V, the reference voltage Vref1=1 V, the reference voltage Vref2=1.7 V, and the reference voltage Vref3=2.7 V, when the input data DIN0 and DIN1 are "1, 1", only the PMOS transistor P1 within the word line switch unit 20 is selected. Therefore, the reference voltage Vref0=3.7 V is transferred to the word line. Consequently, a voltage of 3 V is stored in the cell capacitor C1.

When the input data DIN0 and DIN1 are "0, 0", only the PMOS transistor P2 within the word line switch unit 20 is selected. Therefore, the reference voltage Vref0=1 V is transferred to the word line. Consequently, a voltage of 0.3 V is stored in the cell capacitor C1.

When the input data DIN0 and DIN1 are "0, 1", only the PMOS transistor P3 within the word line switch unit 20 is selected. Therefore, the reference voltage Vref0=1.7 V is transferred to the word line. Consequently, a voltage of 1 V is stored in the cell capacitor C1.

When the input data DIN0 and DIN1 are "1, 0", only the PMOS transistor P4 within the word line switch unit 20 is selected. Therefore, the reference voltage Vref0=2.7 V is transferred to the word line. Consequently, a voltage of 2 V is stored in the cell capacitor C1.

The data storing operation is stopped when the write enable signal is disabled.

As described above, in the present invention, one of the multi-data such as 3 V, 2 V, 1 V, and 0.3 V is stored in one memory cell by the simple circuit construction, and supplementary input/output lines for writing a plurality of data are not necessary. Therefore, noise which may be generated on the supplementary input/output lines is also prevented.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A memory device for storing multi-data comprising:
   an input level detector for receiving data through n input terminals and selecting one of $2^n$ output terminals corresponding to the data inputted to the input terminals;
   a word line switching unit for outputting one of $2^n$ reference voltages corresponding to outputs from the input level detector; and
   a word line driver for receiving the output from the word line switching unit and transferring it to the corresponding word line of the memory device.

2. A memory device for storing multi-data as set forth in claim 1, wherein the word line switching unit includes $2^n$ switch elements; each of the switch elements receives a corresponding reference voltage and provides the corresponding voltage to the corresponding word line.

3. A memory device for storing multi-data as set forth in claim 2, wherein the switch elements include PMOS transistors.

* * * * *